(12) United States Patent
Watson

(10) Patent No.: US 6,873,478 B2
(45) Date of Patent: Mar. 29, 2005

(54) KINEMATIC LENS MOUNT WITH REDUCED CLAMPING FORCE

(75) Inventor: Douglas C. Watson, Campbell, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/446,575

(22) Filed: May 27, 2003

(65) Prior Publication Data
US 2003/0234917 A1 Dec. 25, 2003

Related U.S. Application Data

(60) Provisional application No. 60/390,884, filed on Jun. 21, 2002.

(51) Int. Cl.[7] ............................. G02B 7/02; G03B 27/42
(52) U.S. Cl. ....................... 359/819; 359/818; 359/811; 355/53
(58) Field of Search ................................ 359/819, 818, 359/811, 804, 822; 355/53, 67, 75

(56) References Cited

U.S. PATENT DOCUMENTS

| | | | | |
|---|---|---|---|---|
| 4,726,671 A | | 2/1988 | Ahmad et al. ............... 359/848 |
| 4,733,945 A | * | 3/1988 | Bacich ........................ 359/820 |
| 4,929,054 A | * | 5/1990 | Ahmad et al. ............... 359/820 |
| 5,428,482 A | * | 6/1995 | Bruning et al. ............. 359/827 |
| 5,986,827 A | | 11/1999 | Hale ............................ 359/822 |
| 6,400,516 B1 | | 6/2002 | Spinali ........................ 359/819 |
| 6,552,862 B2 | * | 4/2003 | Dieker ........................ 359/819 |
| 6,556,364 B2 | * | 4/2003 | Meehan et al. ............. 359/822 |
| 2002/0163741 A1 | * | 11/2002 | Shibazaki ................... 359/819 |
| 2003/0234916 A1 | * | 12/2003 | Watson ......................... 355/53 |
| 2003/0234918 A1 | * | 12/2003 | Watson ......................... 355/53 |
| 2004/0008429 A1 | * | 1/2004 | Watson et al. .............. 359/819 |

FOREIGN PATENT DOCUMENTS

| | | |
|---|---|---|
| EP | 1137054 A1 | 9/2001 |
| JP | 2002-131605 | 7/2002 |
| JP | 2002162549 | 9/2002 |
| WO | WO 02/16993 | 2/2002 |

OTHER PUBLICATIONS

Patent Abstracts of Japan, publication No. 64–006917, Komori Shin, *Picture Recorder*, filed Jun. 30, 1987.

* cited by examiner

*Primary Examiner*—Georgia Epps
*Assistant Examiner*—M. Hasan
(74) *Attorney, Agent, or Firm*—Beyer Weaver & Thomas LLP

(57) ABSTRACT

A kinematic lens mount for kinematically mounting an optical element has a holder structure and three clamping units, each affixed to the holder structure and kinematically clamping a peripheral portion of the optical element. Each of these clamping units includes a flexure mount affixed to the holder structure and a spring assembly including a resilient member contacting the optical element. A lens seat is formed integrally with or attached to the flexure mount for supporting the peripheral portion of the optical element thereon. The flexure mount includes a pair of flexure devices. One end of each of these flexure devices is affixed to the holder structure. Each of these flexure devices may be of a pivot type, having an axis along which it is stiff and the axes of this pair of flexure devices intersect each other inside the peripheral portion of the optical element.

16 Claims, 4 Drawing Sheets

KINEMATIC LENS MOUNT WITH REDUCED CLAMPING FORCE

This claims the benefit of provisional application No. 60/390,884 filed on Jun. 21, 2002.

BACKGROUND OF THE INVENTION

This invention relates to a lens mount, or more generally to a device for supporting an optical element such as a refracting lens. In particular, this invention relates to such a kinematic lens mount requiring reduced clamping force, say, for a projection optical system of an exposure apparatus used in a lithography system for fabricating micro-devices or forming masks such as reticles.

It has been known to support an optical element such as a deformable mirror, and more particularly a thin-membrane mirror, by means of many high-stiffness actuators such as PZT actuators, as described, for example, in U.S. Pat. No. 5,037,184 issued Aug. 6, 1991 to Ealey. These many actuators overconstrain the mirror, and overconstrained mirrors have disadvantages for precision control.

Deformable mirrors with low-stiffness force-type actuators for controlling deformation without overconstraint were disclosed by John Hardy ("Active Optics: A New Technology for the Control of Light," IEEE, Vol. 60, No. 6 (1978)) but high-stiffness kinematic mounts are used for controlling the position in six degrees of freedom. Kinematically constrained deformable mirrors with force actuators require some other means for controlling or adjusting the rigid body position.

A quasi-kinematic lens mounting assembly was disclosed in U.S. Pat. No. 6,239,924 issued May 29, 2001 to Watson, adapted to support a lens on a set of mounting seats and also provided with a set of soft mounts for further distributing the gravitational load without overconstraining the lens. A device for kinematically holding an optical element was also disclosed by Shibazaki (WO Publication 02/16993 A1 published Feb. 28, 2002), adapted to support an optical element on bearing surfaces (like seats) on a base member and provided with clamping members each including a pad member with a flexible thin plate portion through which the optical element is clamped by means of bolts.

The optical member to be supported may be very fragile, such as those comprising $CaF_2$. An excessively large clamping force thereon may damage it or cause intolerable deformations. Thus, it is desirable to reduce the clamping force as much as possible while maintaining friction force needed for supporting such an optical element.

SUMMARY OF THE INVENTION

It is therefore an object of this invention to provide an improved kinematic lens clamping unit to be used in a lens mount for kinematically supporting an optical element such as a refracting lens with reduced clamping force.

It is another object of the invention to provide a method of kinematically supporting an optical element such as a refracting lens with reduced clamping force.

It is still another object of this invention to provide a lithography system incorporating an optical system including such a kinematic lens mount.

A kinematic lens mount according to this invention (which may be hereinafter referred to also as a kinematic optical mount in order to make it certain that it will be understood to serve not only for mounting a lens but also for mounting an optical element other than a lens such as a mirror) for kinematically mounting an optical element may be characterized as comprising a holder structure that holds the optical element around its periphery and three, or possibly more, clamping units specially designed according to this invention, each affixed to the holder structure and kinematically clamping a peripheral portion of the optical element. Each of these clamping units is characterized as including a flexure mount affixed to the holder structure and a spring assembly including a resilient member contacting the optical element. A lens seat is formed integrally with or attached to the flexure mount for supporting a peripheral portion of the optical element thereon. The flexure mount includes a pair of flexure devices. One end of each of these flexure devices is affixed to the holder structure. These flexure devices may also be characterized as being of a pivot-type, having an axis along which it is stiff and their axes intersect each other inside the peripheral portion of the optical element, say, above the lens seat.

BRIEF DESCRIPTION OF THE DRAWING

The invention, together with further objects and advantages thereof, may best be understood with reference to the following description taken in conjunction with the accompanying drawings in which.

DETAILED DESCRIPTION OF THE INVENTION

The present invention may be regarded as an improvement over the lens mounting devices and methods described in aforementioned U.S. Pat. No. 6,239,924 and WO Publication 02/16993 A1, and hence these documents will be herein incorporated by reference.

Figure 4:
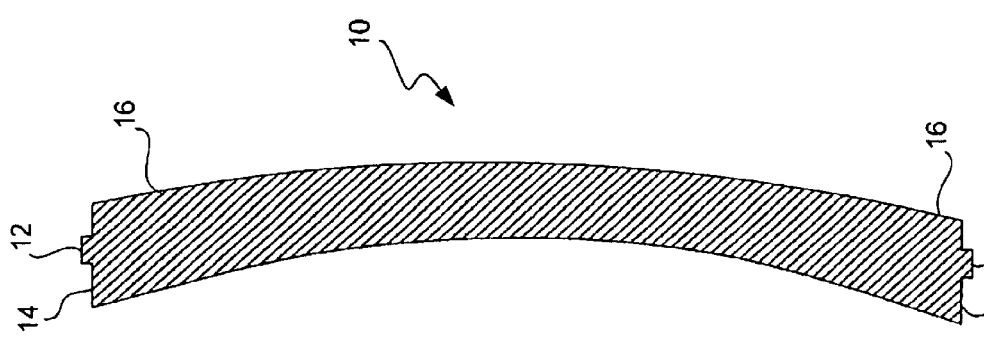
FIG. 4 is a sectional view of a refracting lens as an example of optical element to be mounted in a holder structure of a lens mount embodying this invention.

FIG. 4 shows a refracting lens 10 as an example of the optical element adapted to be supported by a lens mount of the present invention to be described in detail below, preferably including a circumferential flange 12 formed on a peripheral edge 14 thereof. Such a flange is not required but is advantageous in increasing the useful optical surface of the lens 10 and in substantially reducing optical deformation of the edge of the lens 10 due to mechanical clamping force. Conventionally, the lens is often clamped or secured on a peripheral surface portion 16 of the lens but this blocks the optical surface of the periphery of the lens and can deform the lens surface. Since the clamped lens surface is generally curved, furthermore, a clamp on a peripheral surface 16 can also impart a radial force on the lens, causing distortion. If the lens 10 is held and clamped on its circumferential flange 12, any deformation and distortion of the lens 10 and its optical path caused by the mechanical clamping can be minimized.

Figure 5:
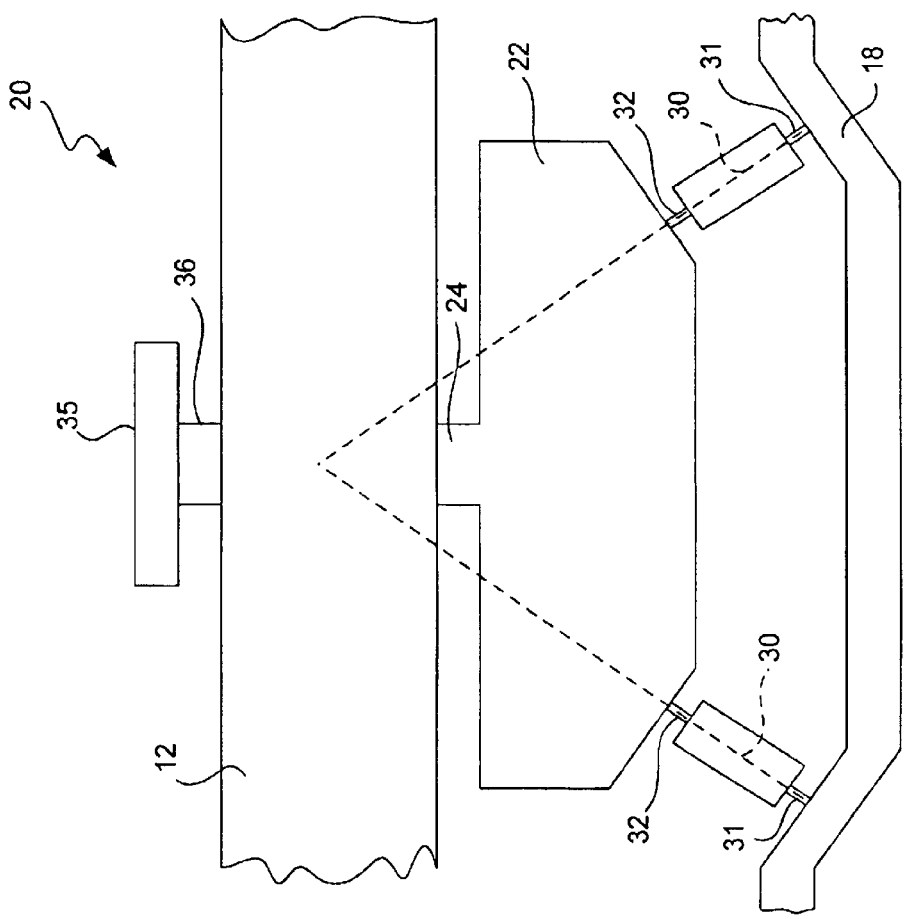
FIG. 5 is a schematic side view of one of the holders of a kinematic lens mount embodying this invention.

A lens mount embodying this invention for kinematically mounting an optical element, such as the lens 10 shown in FIG. 4, includes a holder structure (indicated by numeral 18 in FIG. 5 but not shown in its entirety) adapted to hold the lens 10 peripherally, that is, by its circumferential flange 12. Three clamping units, each of which is illustrated in FIG. 5 at 20, are affixed to the holder structure 18, similarly to the three mounting structures provided to the lens-mounting cells disclosed in aforementioned U.S. Pat. No. 6,239,924, that is, distributed evenly spaced peripherally around the lens 10 as it is mounted in the holder structure 18.

Each of the clamping units 20 includes a flexure mounting structure (or flexure mount) 22 that is separated as a whole from the holder structure 18 but is still integrally connected thereto through a pair of flexure devices 30. A lens seat 24 is formed integrally or attached to a midpoint of the flexure mounting structure 22 for supporting the lens 10 thereon. This center mounting position is intended to substantially eliminate any torsion moment on the flexure mounting structure 22 due to the differential radial expansion of the lens 10 as well as of the holder structure 18.

Each of the flexure devices 30 is of a so-called post type, having stiffness in an axis (shown by a broken line in FIG. 5) along which it extends and is flexible in the other five degrees of freedom. One end of each of the flexure devices 30 (on its axis) forms a flexure point 31 and is connected to the holder structure 18. The other end of each of the flexure devices 30 (also on its axis) forms another flexure point 32 and is connected to the flexure mounting structure 22. The clamping units 20 according to this invention are characterized in that the axes of this pair of flexure devices 30 intersect each other not inside the lens seat 24 but inside the lens 10, or more particularly inside the part of the lens 10 (or its circumferential flange 12) above the lens seat 24.

Each of the clamping units 20 further includes a spring assembly (shown schematically at 35 in FIG. 5) including a resilient member 36 contacting the lens 10. Examples of the spring assembly 35 and its resilient member 36 have been disclosed in aforementioned U.S. Pat. No. 6,239,924 and WO Publication 02/16993 A1. For example, the resilient member 36 may comprise a cantilever blade spring. Thus, the lens 10 (or its flange 12) is clamped on top and bottom surfaces. In order to prevent any unwanted torsion moment from being exerted on the lens 10, it is preferable to direct the clamping force of the spring assembly 35 towards the lens seat 24.

The point at which the aforementioned axes of the pair of flexure devices 30 intersect each other may be referred to as the center of rotation, or center of stiffness, of the flexure mounting structure 22 (stiff only in tangent and axial directions (two degrees of freedom), and flexible in all other four degrees of freedom). This is because when an external force causes the flexure mounting structure 22 to be displaced by a very small amount while its motion is constrained by the pair of flexure devices 30, its rigid-body displacement may be described as a rotation around this point of intersection. Thus, the present invention may be characterized wherein the center of rotation of the flexure mounting structure 22 is shifted from a position inside the lens seat 24 to another position above the lens seat 24 and inside or below the lens 10.

One important consequence of thus shifting the position of the center of rotation of the flexure mounting structure 22 from inside the lens seat 24 to the interior of the lens 10 is that the friction force in the tangent direction of the lens 10 between the lens 10 and the lens mount is now shared between the spring assembly 35 and the seat 24. The force-sharing ratio depends on the center of rotation location and the rotation stiffness of the flexure mount. The net effect is therefore that the friction force is doubled without increasing the force of clamping.

Although the invention was described by way of only one example, this example is not intended to limit the scope of the invention. Many modifications and variations are possible within the scope of the invention. For example, the number of clamping units to be provided to the lens mount is not limited to three, although three clamping units equally spaced around the lens 10 is a preferred configuration because extra clamping units tend to bring about the problem of overly constraining the lens 10. As another example, lens mounts of this invention as described above need not be used for holding a refracting lens but may be used for mounting a mirror. As a further example, a spring assembly of different structure may be substituted. As for the flexure devices 30, although devices having two flexure points 31 and 32 were shown in FIG. 5, this is not intended to limit the scope of the invention. One of the flexure points 31 and 32, for example, may be replaced with a blade such that the number of degrees of freedom may be varied.

Figure 1:
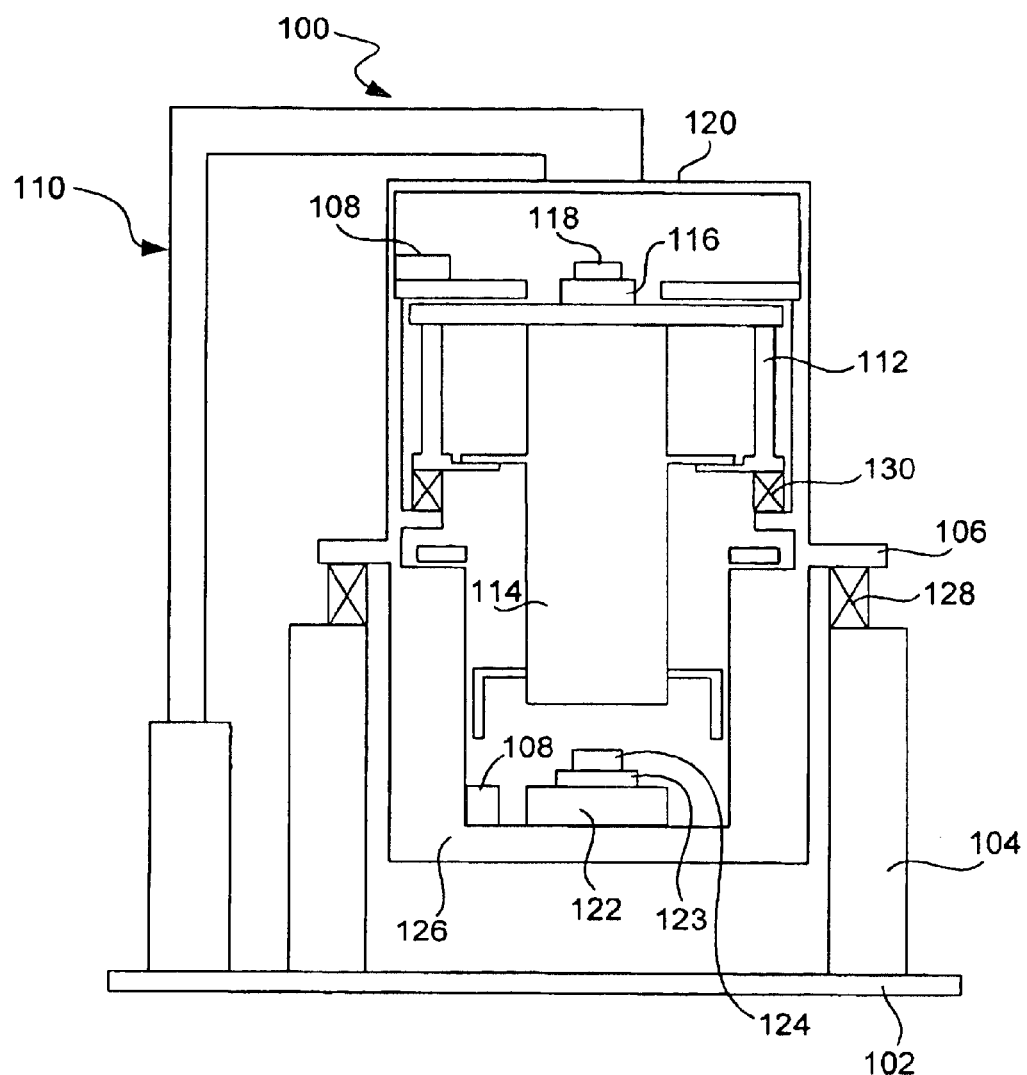
FIG. 1 is a cross-sectional schematic view of a lighographic exposure apparatus incorporating a projection apparatus of this invention.

FIG. 1 shows a typical lithographic exposure apparatus 100 incorporating the deformable mirror of this invention, comprising a mounting base 102, a support frame 104, a base frame 106, a measurement system 108, a control system (not shown), an illumination system 110, an optical frame 112, an optical device 114 which may include the deformable mirror, a reticle stage 116 for retaining a reticle 118, an upper enclosure 120 surrounding the reticle stage 116, a wafer stage 122, a wafer table 123 for retaining a semiconductor wafer workpiece 124, and a lower enclosure 126 surrounding the wafer stage 122.

The support frame 104 typically supports the base frame 106 above the mounting base 102 through a base vibration isolation system 128. The base frame 106 in turn supports, through an optical vibration isolation system 130, the optical frame 112, the measurement system 108, the reticle stage 116, the upper enclosure 120, the optical device 114, the wafer stage 122, the wafer table 123 and the lower enclosure 126 above the base frame 106. The optical frame 112 in turn supports the optical device 114 and the reticle stage 116 above the base frame 106 through the optical vibration isolation system 130. As a result, the optical frame 112, the components supported thereby and the base frame 106 are effectively attached in series through the base vibration isolation system 128 and the optical vibration isolation system 130 to the mounting base 102. The vibration isolation systems 128 and 130 are designed to damp and isolate vibrations between components of the exposure apparatus 100 and comprise a vibration damping device. The measurement system 108 monitors the positions of the stages 116 and 122 relative to a reference such as the optical device 114 and outputs position data to the control system. The optical device 114 typically includes a lens assembly that projects and/or focuses the light or beam from the illumination system 110 that passes through the reticle 118. The reticle stage 116 is attached to one or more movers (not shown) directed by the control system to precisely position the reticle 118 relative to the optical device 114. Similarly, the wafer stage 122 includes one or more movers (not shown) to precisely position the wafer workpiece 124 with the wafer table 123 relative to the optical device (lens assembly) 114.

As will be appreciated by those skilled in the art, there are a number of different types of photolithographic devices. For example, exposure apparatus 100 can be used as a scanning type photolithography system, which exposes the pattern from reticle 118 onto wafer 124 with reticle 118, and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternatively, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
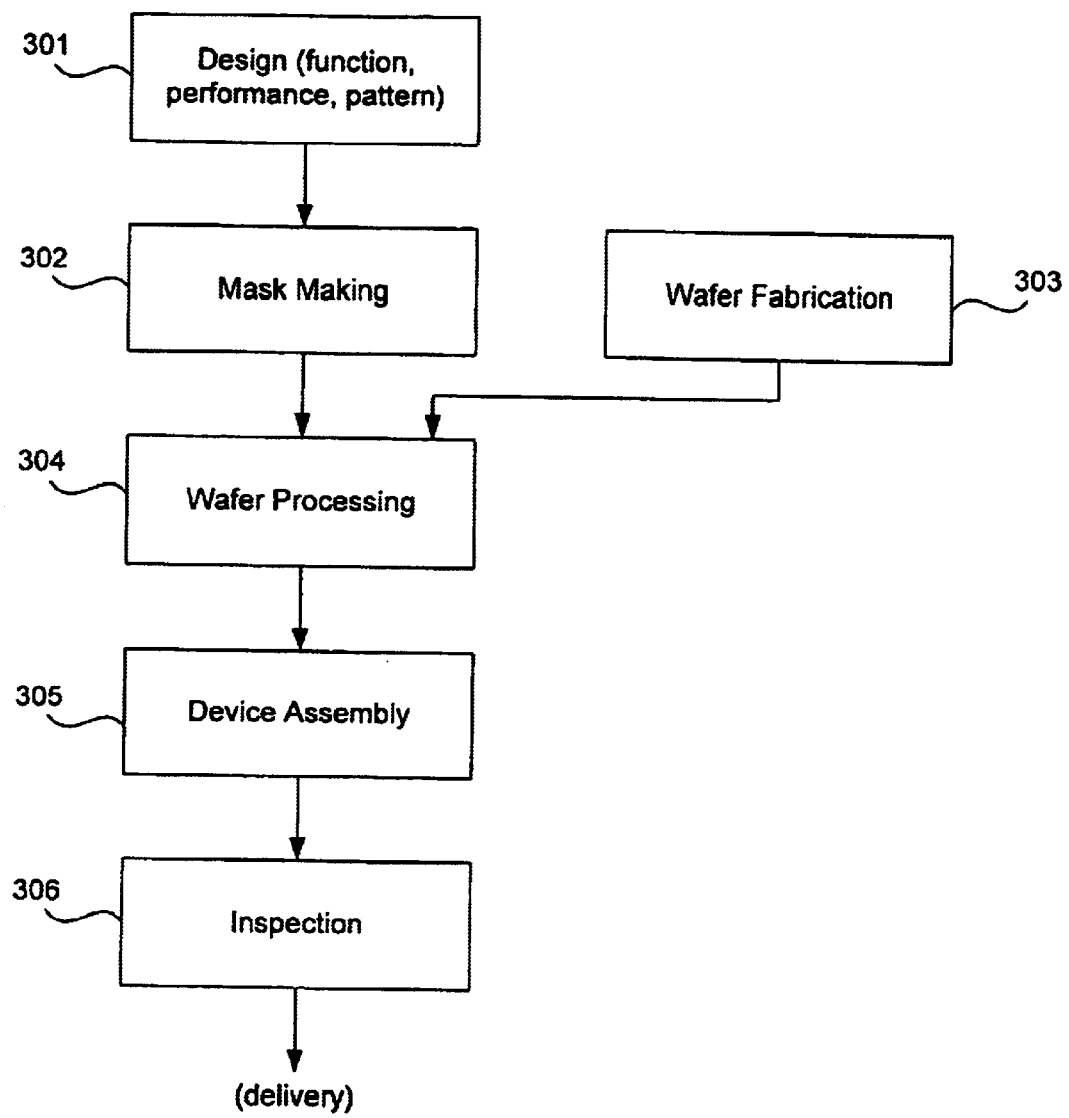
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
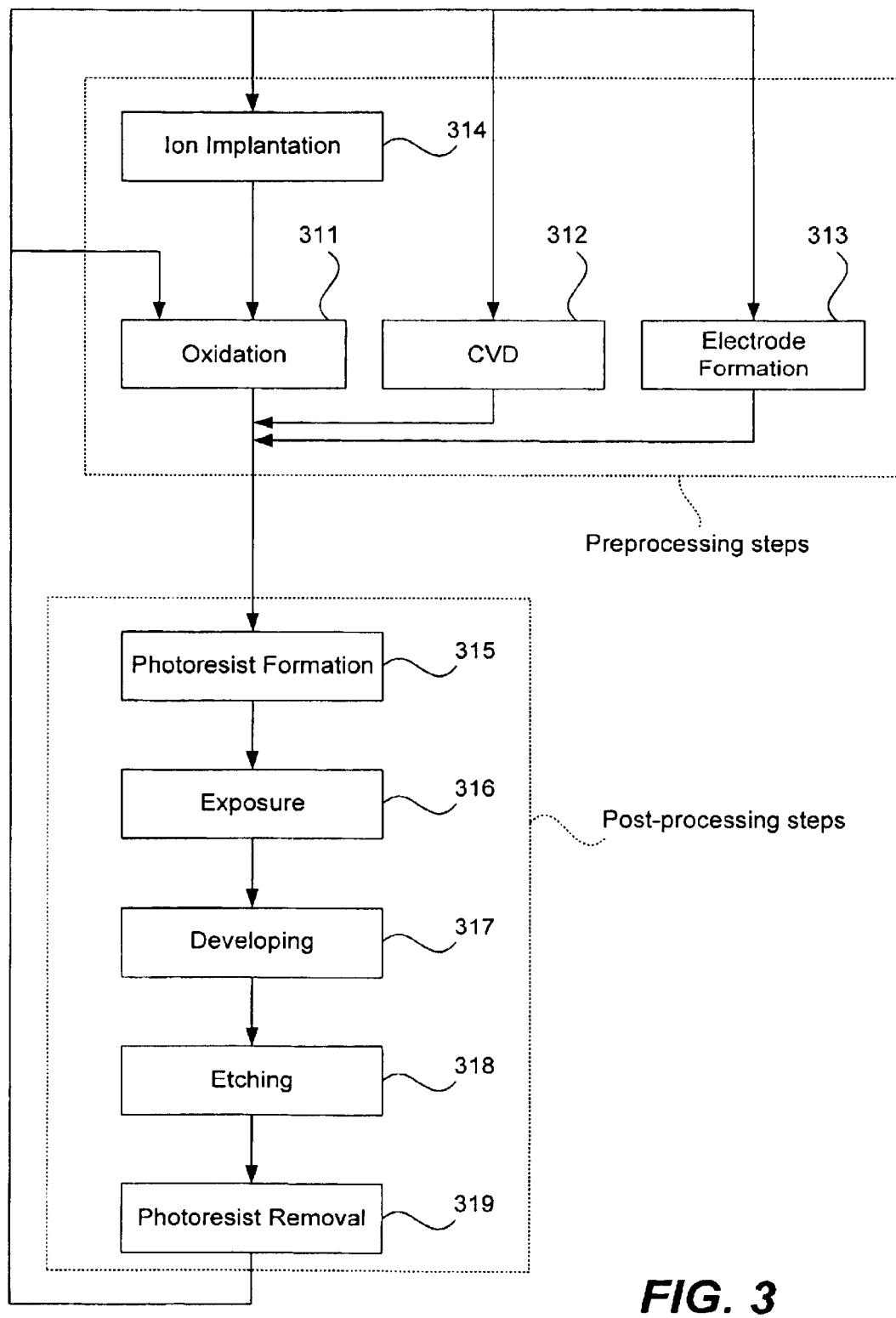
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

What is claimed is:

1. A kinematic optical clamping unit for kinematically clamping a peripheral portion of an optical element; said clamping unit comprising:

a holder structure that holds said optical element around a periphery thereof;

a flexure mount affixed to said holder structure, said flexure mount including a pair of flexure devices and a seat that supports said peripheral portion of said optical element thereon; and a spring assembly including a resilient member contacting said optical element;

wherein one end of each of said flexure devices is affixed to said holder structure, each of said flexure devices has an axis, being stiff along said axis, and the axes of said pair of flexure devices intersect each other inside said peripheral portion of said optical element.

2. The kinematic optical clamping unit of claim 1 wherein said optical element is a refracting lens.

3. The kinematic optical clamping unit of claim 1 wherein said spring assembly applies a clamping force on said optical element in a direction of said seat.

4. A kinematic optical mount for kinematically mounting an optical element, said optical mount comprising:

a holder structure that holds said optical element around a periphery thereof; and a plural number of clamping units each affixed to said holder structure and kinematically clamping a peripheral portion of said optical element, each of said clamping units including a flexure mount affixed to said holder structure, said flexure mount including a pair of flexure devices and a seat that supports said peripheral portion of said optical element thereon, and a spring assembly including a resilient member contacting said optical element, wherein one end of each of said flexure devices is affixed to said holder structure, each of said flexure devices has an axis, being stiff along said axis, and the axes of said pair of flexure devices intersect each other inside said peripheral portion of said optical element.

5. The kinematic optical mount of claim 4 wherein said optical element is a refracting lens.

6. The kinematic optical mount of claim 4 wherein said three clamping units are distributed evenly space peripherally around said optical element.

7. The kinematic optical mount of claim 4 wherein said plural number is three.

8. The kinematic optical mount of claim 4 wherein said spring assembly applies a clamping force on said optical element in a direction of said seat.

9. A method of kinematically mounting an optical element, said method comprising the steps of:

providing a optical mount including a spring assembly with a resilient member and a holder structure having three clamping units affixed thereto, each of said three clamping units including a seat and a flexure mount affixed to said holder structure, said flexure mount including a pair of flexure devices, one end of each of said flexure devices being affixed to said holder structure, each of said flexure devices having an axis and being stiff along said axis; and supporting said optical element peripherally on the seats of said three clamping units; and causing said resilient member to contact said optical element so as to kinematically clamp said optical element peripherally;

wherein the axes of said pair of flexures intersect each other inside said optical element.

10. The method of claim 9 wherein said optical element is a refracting lens.

11. The method of claim 9 wherein said three clamping units are distributed evenly spaced peripherally around said optical element.

12. A lithography system for projecting a pattern on a wafer by a projection beam by preliminarily determining a surface profile of the wafer on a stage and subsequently introducing the stage with the wafer into the projection beam, said lithographic system comprising:

an illumination source;

an optical system including a kinematic lens mount;

a reticle stage arranged to retain a reticle;

a working stage arranged to retain a workpiece; and an enclosure that surrounds at least a portion of the working stage, the enclosure having a sealing surface;

wherein said kinematic optical mount includes:

a holder structure that holds said optical element around a periphery thereof; and a plural number of clamping units each affixed to said holder structure and kinematically clamping a peripheral portion of said optical element, each of said clamping units including a flexure mount affixed to said holder structure, said flexure mount including a pair of flexure devices and a seat that supports said peripheral portion of said optical element thereon, and a spring assembly including a resilient member contacting said optical element, wherein one end of each of said flexure devices is affixed to said holder structure, each of said flexure devices has an axis, being stiff along said axis, and the axes of said pair of flexure devices intersect each other inside said peripheral portion of said optical element.

13. An object manufactured with the lithography system of claim 12.

14. A wafer on which an image has been formed by the lithography system of claim 12.

15. A method for making an object using a lithography process, wherein the lithography process utilizes a lithography system as recited in claim 12.

16. A method for patterning a wafer using a lithography process, wherein the lithography process utilizes a lithography system as recited in claim 12.

* * * * *